(12) United States Patent
Wang et al.

(10) Patent No.: US 7,724,005 B1
(45) Date of Patent: May 25, 2010

(54) HIGH-FREQUENCY STRUCTURES FOR NANOELECTRONICS AND MOLECULAR ELECTRONICS

(75) Inventors: Pingshan Wang, Clemson, SC (US); Chunrong Song, Clemson, SC (US)

(73) Assignee: Clemson University

( * ) Notice: Subject to any disclaimer, the term of this patent is extended or adjusted under 35 U.S.C. 154(b) by 111 days.

(21) Appl. No.: 12/179,047

(22) Filed: Jul. 24, 2008

Related U.S. Application Data

(60) Provisional application No. 60/951,510, filed on Jul. 24, 2007.

(51) Int. Cl.
*G01R 31/02* (2006.01)

(52) U.S. Cl. ...................................... 324/754

(58) Field of Classification Search ......... 324/750–755, 324/760–765, 73.1, 158.1, 716, 719; 438/6, 438/10, 14; 257/235–239
See application file for complete search history.

(56) References Cited

U.S. PATENT DOCUMENTS

| | | | |
|---|---|---|---|
| 6,087,896 A * | 7/2000 | Bazzani | 327/581 |
| 2009/0042383 A1 * | 2/2009 | Kim et al. | 438/619 |

OTHER PUBLICATIONS

Article—G.A. Prinz, "Magnetroelectronics applications," *Journal of Magnetism and Magnetic Materials*, vol. 200, pp. 57-68, 1999.

Article—S.A. Wolf, et al., "Spintronics: A Spin based electronics vision for the future," *Science*, vol. 294, pp. 1488-1495, 2001.
Article—P.J. Burke, "An RF circuit model for carbon nanotubes," *IEEE Trans. Nanotechnology*, vol. 2, pp. 55-58, 2003.
Article—P.J. Burke, "Luttinger liquid theory as a model of the gigahertz electrical properties of carbon nanotubes," *IEEE Transactions on Nanotechnology*, vol. 1, pp. 129-144, 2002.
Article—S.J. Tans, et al. "Room temperature transistor based on a single carbon nanotube," *Nature*, vol. 393, pp. 49-52, 1998.
Article—D.J. Frank, et al. "High-frequency response in carbon nanotube field-effect transistors," *IEEE Electron Device Letters*, vol. 25, pp. 34-36, 2004.
Article—S. Rosenblatt, et al., "Mixing at 50 GHz using a single-walled carbon nanotube transistor," *Applied Physics Letters*, vol. 87, pp. 153111-1-153111-3, 2005.
Book—Y. Taur, et al., *Fundamentals of modern VLSI devices*: Cambridge University Press, 1998.

(Continued)

*Primary Examiner*—Minh N Tang
*Assistant Examiner*—Trung Q Nguyen
(74) *Attorney, Agent, or Firm*—Dority & Manning, P.A.

(57) ABSTRACT

Disclosed is an apparatus and methodology for characterization of small devices. On-chip subtraction of parasitic effects including coupling capacitive effects is provided by way of a rat-race employing a pair of gaps. A device or material being tested is positioned in a test position gap and an output signal is extracted from the rat-race at a position displaced along the rat-race between the test position gap and the other gap to provide subtractive cancellation of any parasitic effects associated with the rat-race and especially associated with the test position gap.

14 Claims, 9 Drawing Sheets

OTHER PUBLICATIONS

Article—W. Wang, et al., "Electronic transport in molecular self-assembled monolayer devices," *Proc. IEEE*, vol. 93, pp. 1815-1824, 2005.

Article—P.L. McEuen, et al., Single-walled carbon nanotube electronics, IEEE Trans. Nanotechnology, vol. 1, pp. 78-85, 2002.

Article—F. Rodriguez-Morales, et al., "Direct and heterodyne detection of microwaves in a metallic single wall carbon nanotube," *Applied Physics Letters*, vol. 89, pp. 083502-1-083502-3, 2006.

Article—A. Naeemi, et al., "Monolayer metallic nanotube interconnects: promising candidates for short local interconnects," IEEE Electron Device Lett., vol. 26, pp. 544-546, 2005.

Article—A. Raychowdhury, et al. Modeling of metallic carbon-nanotube interconnects for circuit simulations and a comparison with Cu interconnects for scaled technologies, *IEEE Transactions on Computer-Aided Design of Integrated Circuits and Systems*, vol. 25, pp. 59-65, 2006.

Article—D.F. Williams, it al., "An optimal vector-network-analyzer calibration algorithm," EEE Trans. on Microwave Theory and Techniques, vol. 51, pp. 2391-2401, 2003.

Article—T.E. Kolding, "A four-step method for de-embedding gigahertz on-wafer CMOS measurements," IIEEE Trans. Electron Devices, vol. 47, pp. 734-740, 2000.

Article—A.A. Pesetski, et al., "Carbon nanotube field-effect transistor operation at microwave frequencies," *applied Physics Letters*, vol. 88, pp. 113103-1-113103-3, 2006.

Article—M. Zhang, et al., "Radio-frequency characterization for the single-walled carbon nanotubes," *applied Physics Letters*, vol. 88, pp. 163109-1-163109-3, 2006.

Article—S. Li, et al., "Carbon nanotube transistor operation at 2.6 GHz," *Nano Letters*, vol. 4, pp. 753-756, 2004.

Article—Z. Yu, et al., "Microwave nanotube transistor operation at high bias," *Applied Physics Letters*, vol. 88, pp. 233115-1-233115-3, 2006.

Article—D.V. Singh, "Frequency response of top-gated carbon nanotube field-effect transistors," *IEEE Trans. Nanotechnology*, vol. 3, pp. 383-387, 2004.

Article—H.-R. Ahn, "Miniaturized 3-dB ring hybrid terminated by arbitrary impedances," IEEE Transactions on Microwave Theory and Techniques, vol. 42, pp. 2216-2221, 1994.

Article—H. Ghali, et al. "Miniaturized fractal rat-race, branch-line, and coupled-line hybrids," *IEEE Transactions on Microwave Theory and Techniques*, vol. 52, pp. 2513-2520, 2004.

Article—T. Wang, et al., "Size-reduction and band-broadening design technique of uniplanar hybrid ring coupler using phase inverter for M(H)MIC's," *IEEE Transactions on Microwave Theory and Techniques*, vol. 47, pp. 198-206, 1999.

Article—C.-H. Ho, et al., "Broad-band uniplanar hybrid-ring and branch-line couplers," *IEEE Transactions on Microwave Theory and Techniques*, vol. 41, pp. 2116-2124, 1993.

* cited by examiner

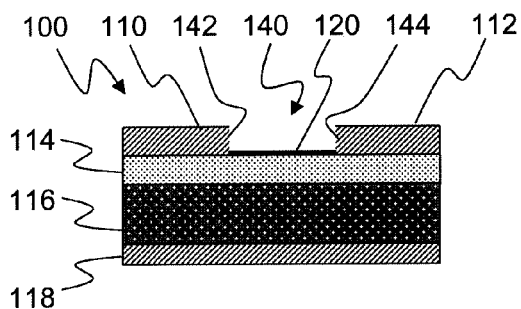
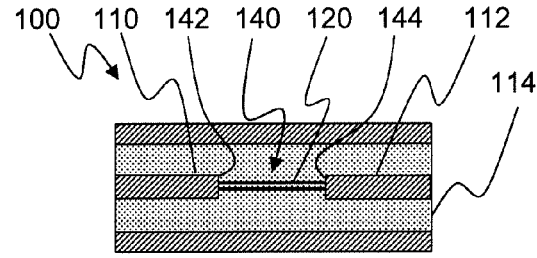
FIG. 1(a)    FIG. 1(b)
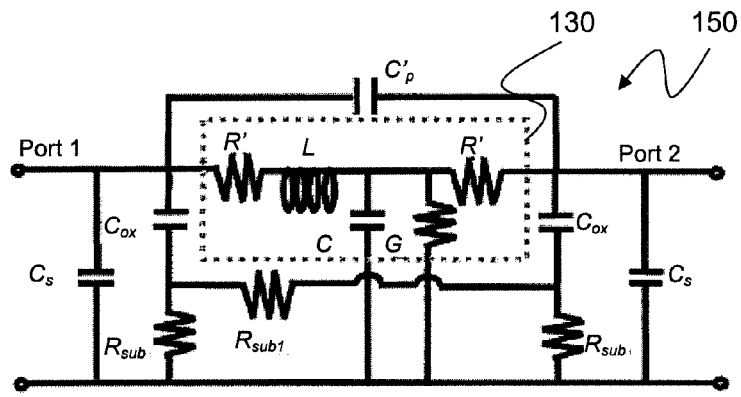
FIG. 1(c)
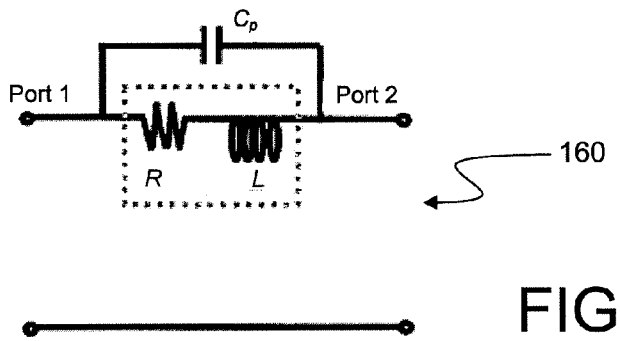
FIG. 1(d)

HIGH-FREQUENCY STRUCTURES FOR NANOELECTRONICS AND MOLECULAR ELECTRONICS

FIELD OF THE INVENTION

The present subject matter relates to high-frequency characterization of small devices and minute amounts of materials. More specifically, the present subject matter discloses methods and apparatus for carrying out an on-chip subtraction process to reduce parasitic effects in measurement fixtures including coupling capacitance effects.

BACKGROUND OF THE INVENTION

Parasitic effects from measurement fixtures are difficult to handle in microwave characterization of small devices and materials. It is even more challenging when the expected signal level is low. Such devices include magnetroelectronic/spintronic devices and high-impedance devices, for instance a metallic single-walled-carbon-nanotube (mSWNT), a SWNT transistor, a minimum-size deep-submicron metal-oxide-semiconductor (MOS) field-effect-transistor (FET), a sub-micron MOS FET that is operating in sub-threshold region, and a molecular device. Such materials include on-chip biofluids, chemicals and thin films. The microwave characteristics of these devices and materials are of great interest in their development and applications. Considering a metallic SWNT as an example; its high-frequency characteristics are important for potential interconnect and sensor applications. Metallic SWNTs are also considered an ideal, one-dimensional model for fundament condensed matter physics studies. Their high-frequency properties, which correspond to collective Plasmon oscillations, would be a direct verification of Luttinger liquid theory that was proposed to describe one-dimensional material.

A proposed RF transmission line model as illustrated enclosed in the dashed-line box 130 in FIG. 1(*c*), has often been the focus and foundation for previous mSWNT studies. It has been predicted that mSWNTs have very high characteristic impedance, on the order of 10 k$\Omega$ due to high kinetic inductance and includes a large contact resistance component of a few k$\Omega$ or higher. Under these conditions, signal attenuation and reflection are very high when currently available microwave measurement systems are used for their characterizations. The difficulty is further complicated by the parasitic effects coming from RF test fixtures, especially the effects from gap coupling capacitor equivalently illustrated at $C'_p$ (FIG. 1(*c*)) and $C_p$ (FIG. 1(*d*)), in typical measurement arrangements.

The calculated scattering parameters, $S_{21}$, of the equivalent circuit 140 (FIG. 1(*d*)) as illustrated in FIGS. 2(*a*) and 2(*b*) of several situations exemplify the measurement challenge. At low frequencies, the contact resistance (R) dominates; at high frequencies, the coupling capacitance ($C_p$) dominates. The inductance effect, which is an indication of transmission line characteristics is indistinguishable from the combined coupling capacitance and contact resistance effects. Moreover, measurement uncertainties, including contact uncertainties from one measurement to another, make it difficult to use various de-embedding or off-chip approaches that have been developed for deep sub-micron CMOS device characterizations. As a result, only limited success has been achieved in the efforts on high-frequency mCNT property and potential application investigations. These efforts include the development of measurement methods for CNT devices. Previously attempted direct scattering parameter measurements, resonant circuit techniques, and heterodyne methods have not been successful in addressing the measurement difficulties for the characterization of the equivalent transmission line model of a mCNT. For instance, the exceptionally large and unique "kinetic" inductance associated with mCNTs has not yet been experimentally verified and characterized.

While various measurement methods for characterizing CNT devices have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved methodology for characterizing, i.e., taking electrical measurements of, small devices and minute amounts of materials has been developed.

In an exemplary configuration, parasitic capacitance effects resulting from a coupling gap capacitor effect are reduced.

In one form, the present subject matter provides an on-chip subtraction mechanism to reduce parasitic effects of a test fixture.

In accordance with aspects of certain embodiments of the present subject matter, microwave structure for on-chip parasitic effect subtraction is provided.

In accordance with certain aspects of other embodiments of the present subject matter, methodologies have been developed to direct an incoming signal along two paths or branches of a hybrid to produce at an output of the hybrid a difference signal with significantly reduced parasitic components.

In accordance with aspects of still further embodiments of the present subject matter, similar test fixtures or a test fixture and a capacitive component having a capacitive value similar to a test fixture may be positioned in a hybrid device such that signals from each fixture or fixture and capacitive component are effectively subtracted from each other to cancel parasitic effects that may inhibit accurate characterization of a device or material under test secured in a test fixture.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1(a) is a cross-section of an exemplary mCNT test set-up including metallic electrodes for facilitating characterization measurements;

FIG. 1(b) is a top-view of the test setup of FIG. 1(a);

FIG. 1(c) is an equivalent circuit model of the test setup;

FIG. 1(d) is a simplified equivalent circuit model of the test setup;

Figure 2A:
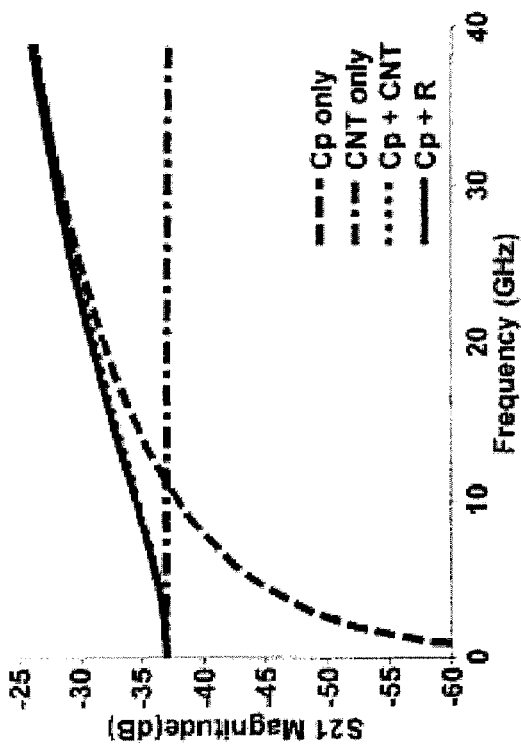
FIGS. 2(a) and 2(b) graphically illustrate the simulated scattering magnitude and phase parameters respectively of the equivalent circuits of FIGS. 1(c) and 1(d)

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with an improved methodology for characterizing, i.e., taking electrical measurements of, small devices and minute amounts of materials.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject device characterization apparatus and methodologies. Referring again to FIGS. 1(a) to 1(d), it will be seen that FIGS. 1(a) and 1(b) correspond to cross-sectional and top views respectively of a test set-up 100 including a metallic carbon nanotube mCNT 120 coupled between a pair of metallic electrodes 110, 112 to facilitate characterization measurements. In an exemplary configuration mCNT 120 and electrodes 110, 112 may be mounted on a $SiO_2$ layer 114 overlying a Si substrate 116. Substrate 116 may itself be mounted on a metallic support structure 118 which may be coupled to a reference (ground) potential.

As may be seen in FIG. 1(c), the test set-up of FIGS. 1(a) and 1(b) may be represented by equivalent circuit 150. A transmission line model of mCNT 120 is generally represented by the equivalent circuitry illustrated within dash line box 130. The pair of resistors R' represent the dominant contact resistance component. Capacitor $C'_p$ represents the coupling capacitance of the gap 140, which is required to host a device under test (DUT). In the present exemplary configuration, capacitor $C'_p$ represents the capacitance created by ends 142, 144 of electrodes 110, 112, respectively, and the gap 140 between such electrode ends 142, 144.

Capacitors $C_{ox}$ represents excess electrode capacitance due to end effects while resistors $R_{sub}$ and $R_{sub1}$ represent substrate resistances. Capacitors $C_s$ represent the excessive coupling capacitance between the signal lines and ground due to end effects.

FIG. 1(d) represents a simplified equivalent circuit 160 where the substrate parasitic components are ignored, mCNT is approximated by setting R equal to 2R' and the value of L remaining equal to the value of L in FIG. 1(c). In instances where a high resistivity substrate is used in the test set-up, corresponding resistances can be considered infinite. Coupling capacitor $C_p$ in simplified equivalent circuit 160 includes contributions from all the other relevant capacitive components illustrated in FIG. 1(c).

Figure 2B:
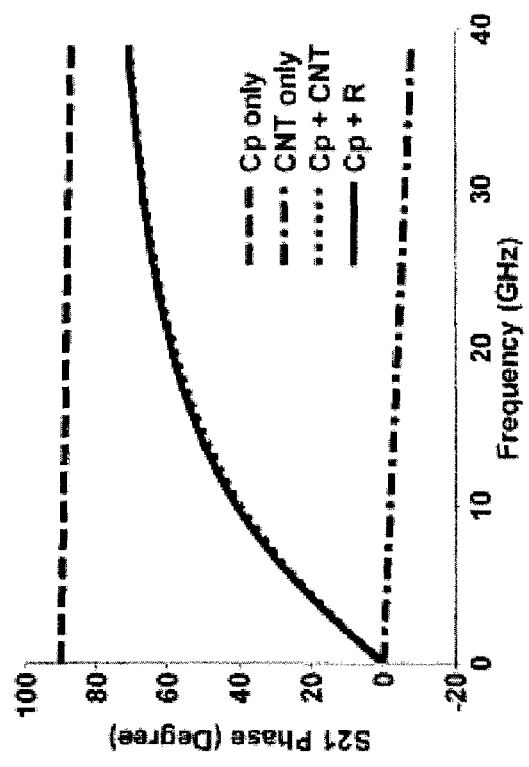

With reference now to FIGS. 2(a) and 2(b) there are graphically illustrated simulated scattering magnitude and phase parameters respectively of the equivalent circuits of FIGS. 1(c) and 1(d) with $C_p$=2fF, R=2R'=7 kOhm, L=4 nH and with different circuit component combinations as noted on the graphs. These exemplary parameters were selected based on present knowledge of metallic SWNTs. It should be apparent to those of ordinary skill in the art that a mCNT transmission line model can be simplified as is shown in FIG. 1(d) as previously discussed. It should also be clear that resistance R dominates performance of CNT. When frequency is above about 10 GHz, $C_p$ dominates performance of the circuit. As a result, it is difficult to characterize inductance L by use of conventional characterization methods.

In accordance with the present technology, a new methodology has been developed for the characterization of small devices that uses on-chip subtraction to significantly reduce parasitic effects of the test fixture with a focus on reducing the coupling gap capacitor effect.

Figure 3A:
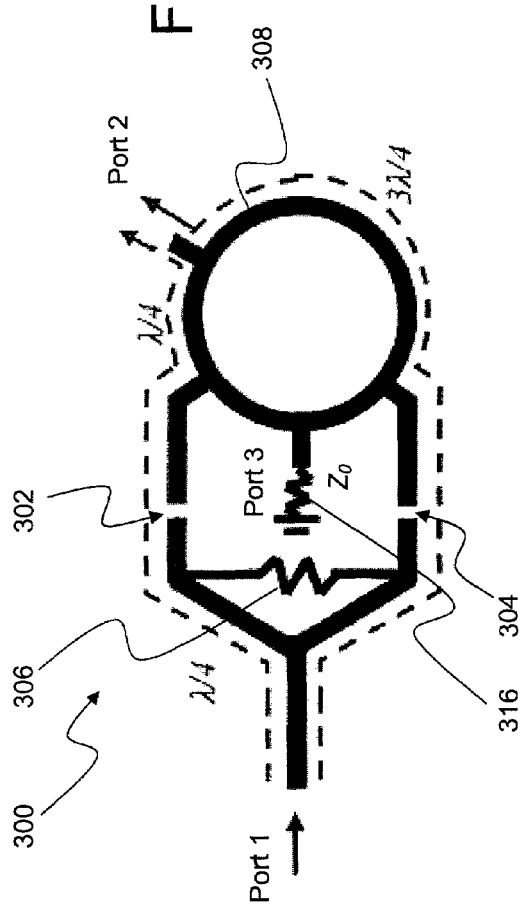
FIG. 3(a) is a schematic diagram of a microwave hybrid structure in accordance with the present subject matter.

With reference to FIG. 3(a), there is illustrated a schematic representation of a microwave structure 300 constructed in accordance with the present technology for on-chip parasitic effect subtraction. As may be seen in FIG. 3(a), an incoming microwave signal coupled to Port 1 is evenly split via a 3-dB power divider into two branches. Strong reflections will occur at the two gaps 302, 304 along the two branches. Resistor 306 in the power divider will absorb the reflected signal and provide isolation between the two branches. Signals that are transmitted across gaps 302, 304 then propagate to the "rat-race" hybrid 308.

Figure 3B:
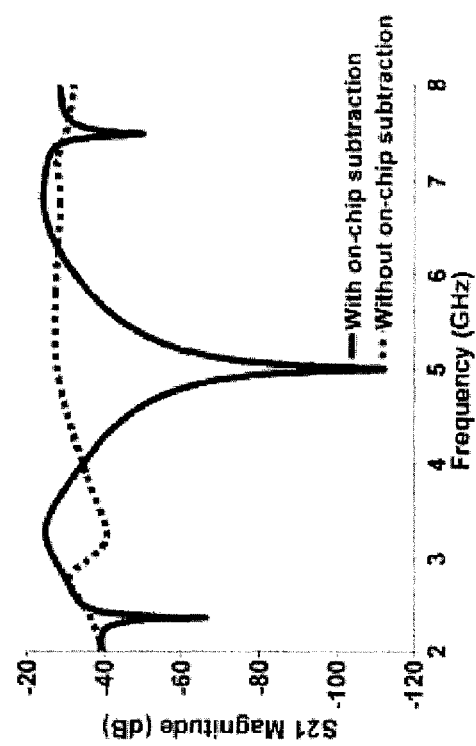
FIG. 3(b) is a graphical representation of simulated scattering parameters between the two branches of the hybrid structure of FIG. 3(a)

As may be seen from FIG. 3(a), the signal passing through gap 302 enters rat-race 308 and passes along a λ/4 portion of the rat-race until it reaches Port 2. In similar fashion, a signal passing through gap 304 enters rat-race 308 and passes along a 3λ/4 portion of the rat-race before reaching Port 2. Since the signals arriving at Port 2 are separated by λ/2, i.e. 180°, the output signal from Port 2 corresponds to the difference of the two signals that come from gaps 302 and 304. Resistor 316 coupled between Port 3 and a reference potential (ground) will absorb common mode signals from the two branches. As a result the parasitic effects, including the coupling effects, are greatly reduced as illustrated in FIG. 3(b).

It should be readily understood by those of ordinary skill in the art that if gaps 302 and 304 are substantially identical, the transmission paths from the gaps toward rat-race 208 are substantially identical, and the transmission paths around the rat-race are substantially λ/2 different as they each arrive at Port 2, the signal at Port 2 will be substantially zero. That is, the signals passing through each branch of the circuit will substantially balance each other out thus compensating for any parasitic effects that may be present in the test fixture corresponding to gap 302 or, alternatively, gap 304.

With further reference to FIG. 3(a), a measurement approach to the characterization of small devices may proceed as follows. In the following example, one may assume that the reference impedance of the measurement system is $Z_0$ which is also the matching impedance of the power divider and the hybrid 308 in FIG. 3(a). Assume low-loss transmission lines with signal propagation factors $\exp(-\alpha_{ij}l_i - j\beta_{ij}l_i) = \exp(-\alpha l_{ij} - j\theta_{ij})$ in FIG. 3(b). If the attenuation constant $\alpha_{ij}$ and the phase propagation constant $\beta_{ij}$ are the same for the corresponding line sections in each branch, then the scattering parameter $S_{21}$ is:

$$S_{21} = \exp\left(-\alpha \sum_i l_i - j\left(\sum_i \theta_i\right)\right) \quad \text{eq. 1}$$

$$(S_{21(CNT+C_p)} - \exp(-\alpha\lambda/2)S_{21(C_p)})(S_{21(Power\ Divider)})(S_{21(Hybrid)})$$

where $S_{21(CNT+Cp)}$ is the scattering parameter of the gap with an mCNT and $S_{21(Cp)}$ is the scattering parameter of the other gap. The attenuation and phase delay associated with the transmission lines in the test fixture can be calculated and/or experimentally obtained by use of a dummy structure, such as the one shown in FIG. 6(b). The structure is identical to the test fixture of FIG. 6(a), but with only a gap in one branch. The coupling capacitance values of the gap can be obtained through measurement, calculation or simulation.

Figure 4A:
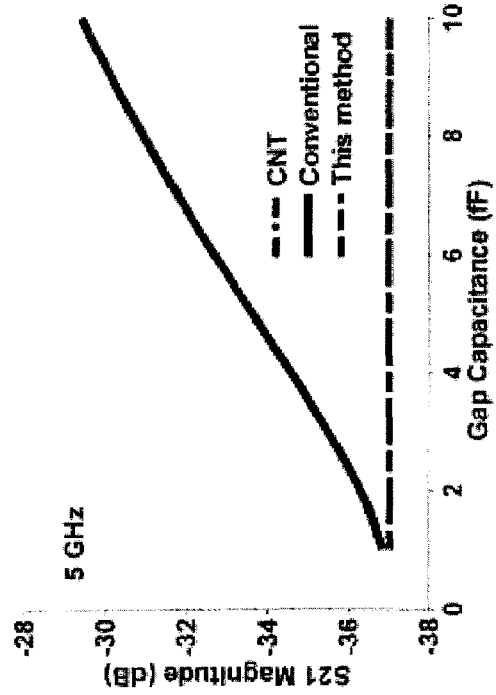
FIGS. 4(a) and 4(b) provide graphical magnitude and phase comparisons respectively of measured scattering parameters determined by the present and conventional methodologies.
Figure 4B:
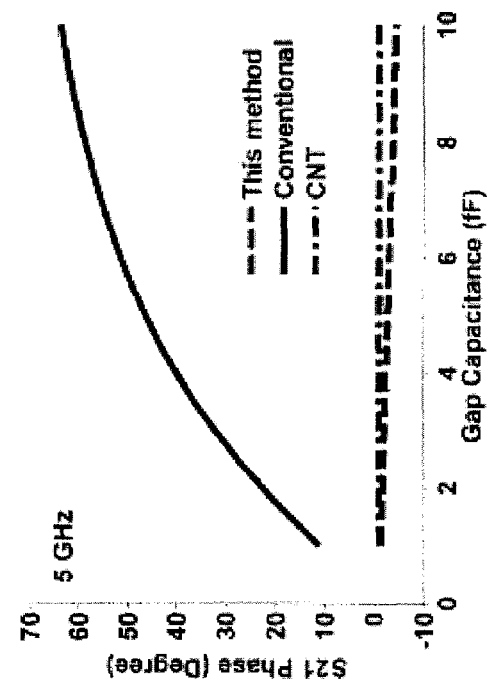

When the used mCNT is a few μm long and the operating frequency is on the order of 10 GHz, a lumped RL model can be used to approximate the distributed transmission line CNT model, as is shown in FIG. 1(d). The calculated s-parameter $S_{21}$ of the mCNT using the simplified model are shown in FIGS. 4(a) and 4(b). It is clear that signals passing through the coupling capacitance of the gap dominate if no subtraction is applied, consistent with the information obtained in FIGS. 2(a), 2(b), and 3(b). The method in accordance with the present technology yields results that are good approximations of the mCNT even when the coupling capacitance is relatively large and varies across a relatively large range.

From the obtained scattering parameters, resistance R and inductance L can be obtained through the following equations.

$$R \approx \frac{2Z_0(1 - |S_{21}|)}{|S_{21}|}(\Omega) \quad \text{eq. 2(a)}$$

$$L \approx \frac{(2Z_0 + R)\tan(-\text{Angle}(S_{21})) - 4Z_0\omega RC_p}{\omega}(H) \quad \text{eq. 2(b)}$$

The extraction of L still needs the knowledge of C, unless the corresponding term is small in eq. (2b). Nevertheless, as shown in FIGS. 4(a) and 4(b), the accuracy of the extracted CNT parameters on the accuracy of C, is de-sensitized even though the accuracy of the method in accordance with the present technology deteriorates when the gap capacitance becomes large. On the other hand, a gap with a few fF of capacitance is amicable for fabrication and device characterization, where reasonable accuracy can be achieved.

Figure 5B:
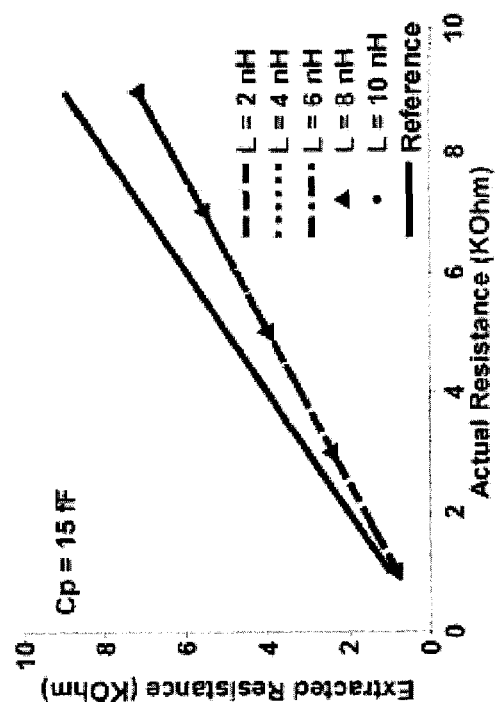
FIGS. 5(a) and 5(b) illustrate respectively extracted inductance and resistance values for different resistive and inductive combinations.
Figure 5A:
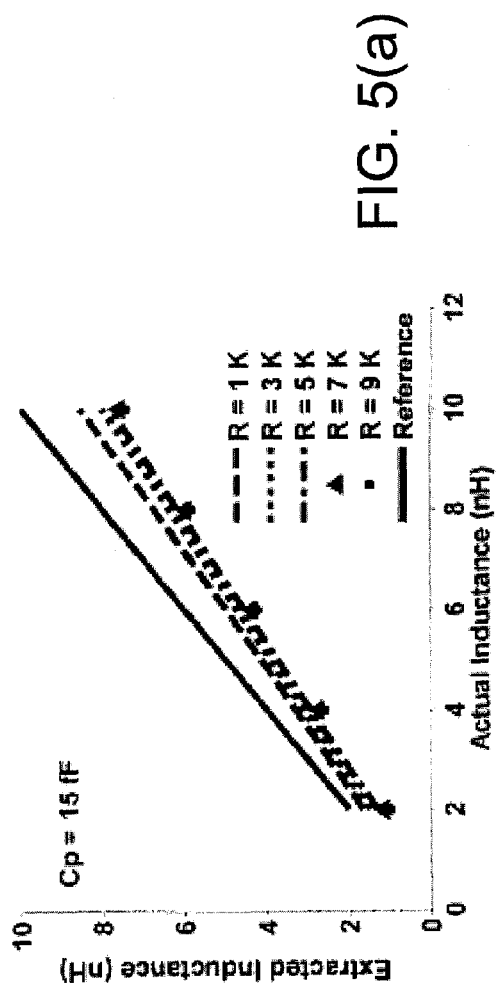

The method in accordance with the present technology may be tested numerically using a known network having the topology as illustrated in FIG. 1(d). FIGS. 5(a) and 5(b) present extracted inductance and resistance for different given R and L combinations using the present technology. As is evident from an inspection of FIGS. 5(a) and 5(b), resistance R extraction does not depend on L values, while L extraction does depend on R slightly. The smaller the gap capacitance is, the more accurate the extracted parameters are. As may further be observed from FIGS. 5(a) and 5(b), the accuracy of the present characterization methodology does vary somewhat from the ideal as represented by the reference line, however, it is believed that the attained accuracy is quite acceptable considering the challenges of the targeted measurement applications.

Figure 6B:
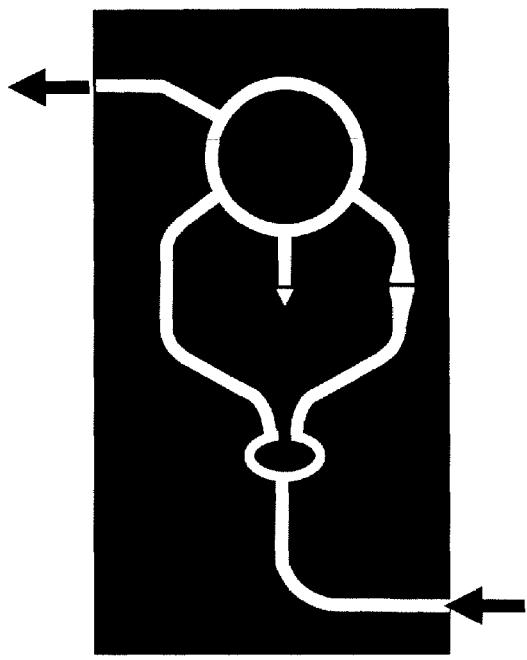
FIGS. 6(a) and 6(b) illustrate layouts of measuring circuits used to evaluate the technology of the present subject matter.

Since it is difficult to find circuit components that can be used to mimic the network in FIG. 1(d) to verify the methodology of the present technology, small capacitors are used instead. These capacitors are realized by changing the microstrip line gap width, shown in FIG. 6(a). The capacitance value is chosen so that the output signal level is similar to that from a single mCNT. In order to demonstrate operation of the present technology, three test structures were fabricated with their gap widths increased by 10%, 30%, and 50%, compared to the original 50Ω microstrip-line width. The gap space was 20 mils. The structures consist of a conventional 3 dB Wilkinson power divider and a 3 dB 180° phase shift ring-hybrid (Rat-race hybrid) at 5 GHz. A "THRU" structure (i.e., a structure without a gap) in FIG. 6(b) is used to characterize the transmission coefficients in eq. (1). All ports are matched to 50Ω. Roger RT/Duroid 5870 substrate with thickness h=31 mils and $\varepsilon_r$=2.33 was used. ADS simulations are also conducted to verify both theoretical analysis and experimental results. A modified equation gives the capacitance as:

$$C \approx \frac{1}{2Z_0\omega} \cdot \sqrt{\frac{|S_{21}|^2}{1 - |S_{21}|^2}} F \quad \text{eq. 3}$$

Figure 7A:
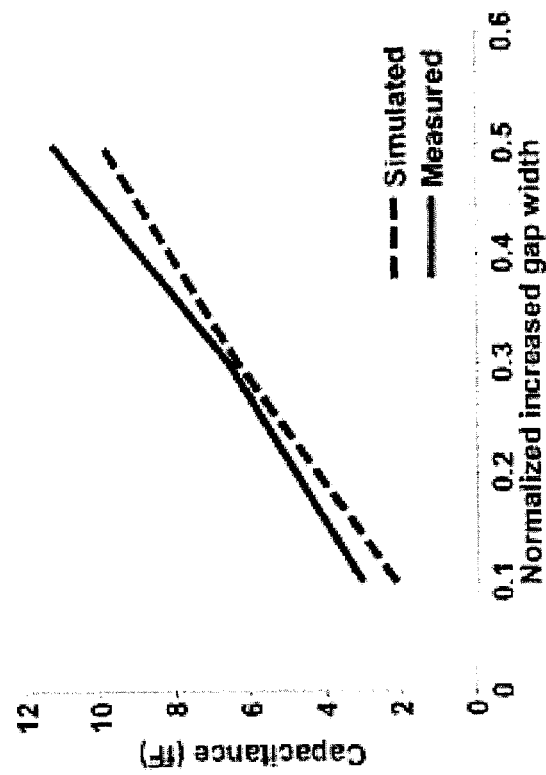
FIG. 7(a) graphically illustrates on-chip parasitic effects cancellation.

FIG. 7(a) shows the cancellation effects of the fabricated structures. If the two signal paths are symmetric, the output signal should be approximately zero after the cancellation, such as the lowest signal point of the simulated results (at −5 GHz). In practice, however, various factors affect the effectiveness of the cancellation process. Two prominent ones are the fabrication variations and surface wave excitations. Despite these complications, the measured $S_{21}$ in FIG. 7(a) demonstrate a approximate 23 dB reduction of the parasitic (gap coupling) effects when compared with the measured results of a single gap at 5 GHz. When compared with the predicted $S_{21}$ in FIG. 4, the subtraction process should be reasonable for mCNT characterization.

Figure 7B:
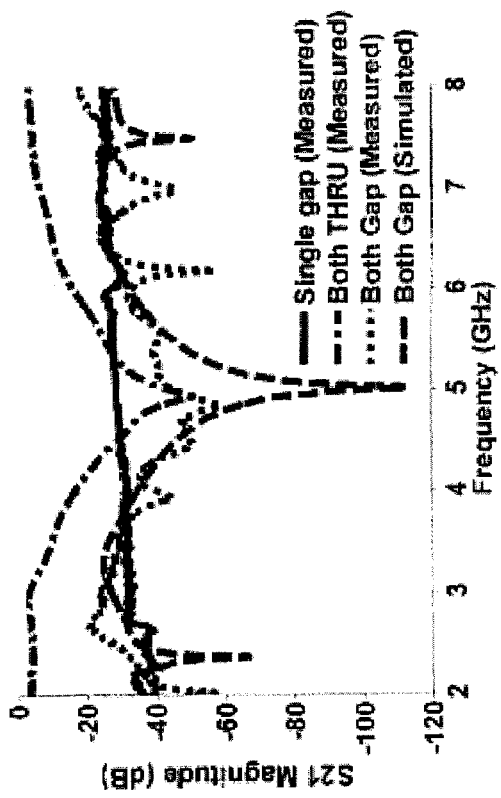
FIG. 7(b) graphically illustrates variations between measured and simulated capacitance values based on a normalized increasing gap width.

FIG. 7(b) shows that the extracted capacitance values from the measured data are close to the simulated results with ADS. Furthermore, the measured capacitance ratios are approximately the gap-width ratios, as expected. These agreements verified the validity of the proposed method. When the gap has about 10% width increase, the discrepancy between the simulated and the measured capacitance are larger. This is due to the relatively lower signal level that is closer to the noise background.

There are a few issues that determine the accuracy, sensitivity and applications of the proposed measurement method. The symmetry of the proposed structures is an important such feature. Any non-symmetric geometry between the upper branch and the lower branch will cause non-symmetric electrical behaviors, which will eventually appear at the output port in FIG. 3. For instance, a non-symmetric 3-dB power division, non-symmetric transmission line widths (hence different attenuation constant, phase constant and gap capacitance) and non-symmetric hybrid connections will introduce a difference signal at port 2. A non-symmetric substrate will further complicate the cancellation process. In addition, any non-symmetric fabrication scratches on the substrate surface would probably contribute to a less than ideal on-chip subtraction process.

Figure 8A:
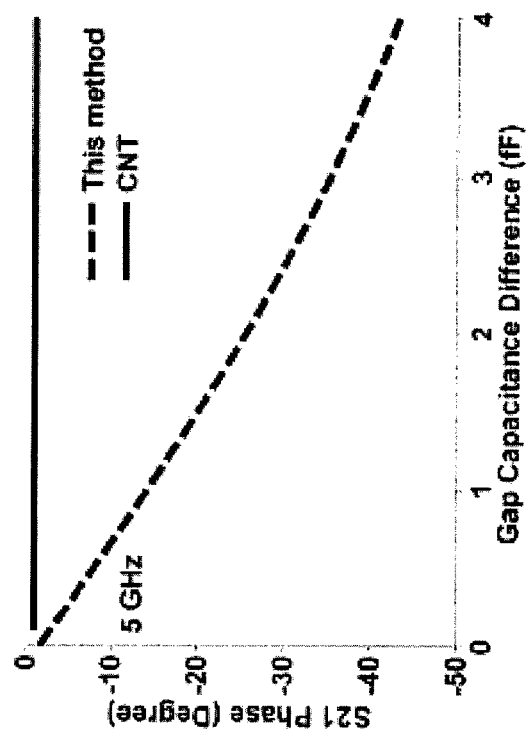
FIGS. 8(a) and 8(b) graphically illustrate magnitude and phase effects comparisons respectively of non-symmetrical gap capacitance on extracted scattering parameters.
Figure 8B:
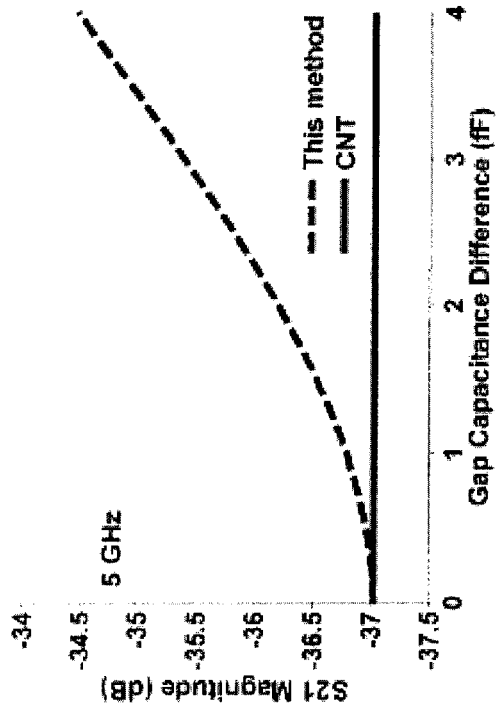
Figure 9B:
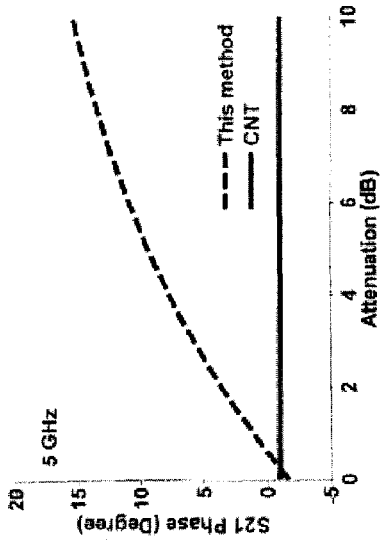
FIGS. 9(a)-9(d) graphically illustrate the effects of non-symmetrical attenuation and phase delay on extracted scattering parameters.
Figure 9D:
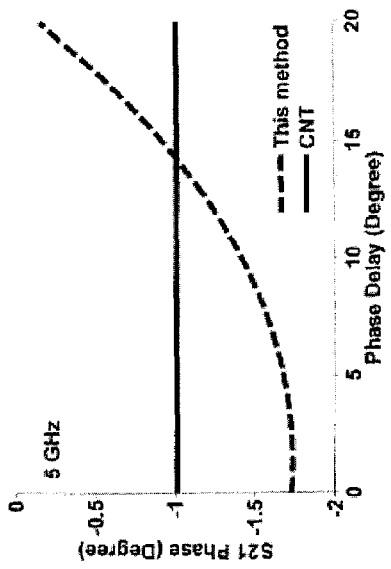
Figure 9A:
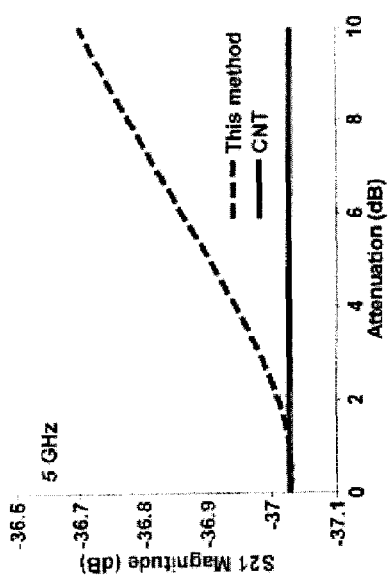
Figure 9C:
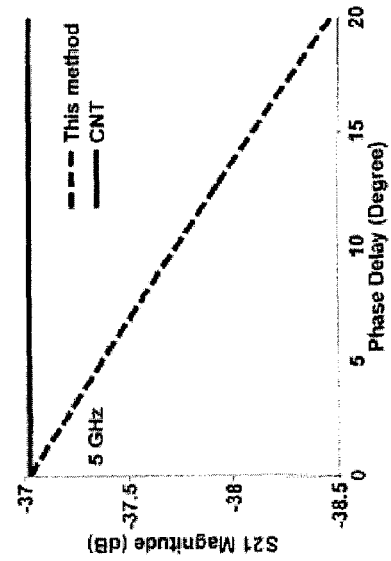

When a gap is needed for characterization purposes (such as mCNT characterizations), its attenuation will dramatically reduce the effects of the non-symmetric power division and the non-symmetric transmission line sections that lead to the gap. As a result, the symmetry of the gap and the sections of the structure after the gap are more important. FIG. 8 shows the extracted s-parameter $S_{21}$ the non-symmetric gap capacitance at 5 GHz provided the rest of the structure is ideally symmetric. Clearly, larger error occurs when gap non-symmetry increases. Fortunately, it is not too difficult to control gap symmetry to a level that satisfies a reasonable accuracy under current fabrication technology.

FIG. 9 shows the effects on the extracted scattering parameters from non-symmetric phase constant and attenuation constant. It is expected that the main attenuation limitation comes from the half-wave-length line (attenuation) difference of the hybrid. This attenuation dictates the choice of substrates and structure design for nano-device characterizations.

Figure 6A:
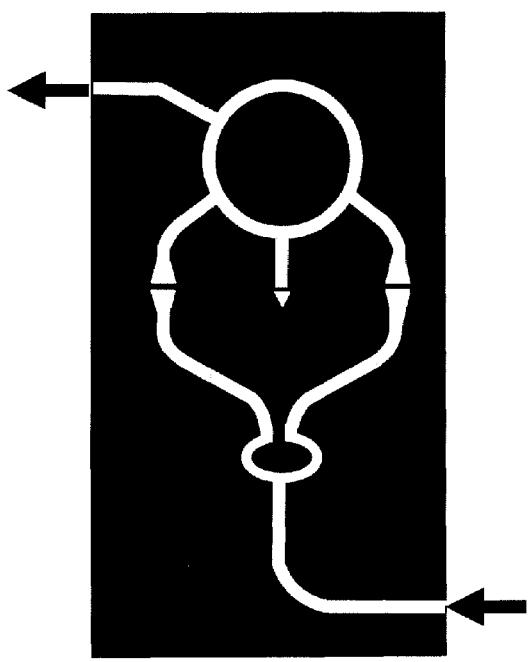

The structures in FIGS. 6(a) and 6(b) are big, comparable with the microwave wavelength. The dimensions of the designed structures are mainly determined by the power divider and the hybrid-ring. For GHz frequency or below, the structures may be too big to meet the sample size limitations of some nanofabrication equipment. As a result, miniaturized designs need to be developed. The results of some current efforts, such as the dramatic size reduction of a rat-race hybrid and power divider can be exploited.

The method in accordance with the present technology works ideally at one frequency only. Both the measured and simulated results show a very narrow band. This bandwidth limitation mainly comes from the design of the hybrid, where a 180' phase shift is needed for the two incoming common-mode signals to cancel each other.

Metallic SWNT is used as an example in this work to illustrate the present microwave characterization method, where the gap coupling capacitance dominates. There are other application situations where no gap is needed to host the device-under-test (DUT) or material-under-test (MUT) while the expected signal level is relatively weak. One example is the characterization of individual micro/nano magnetic structures. The present cancellation method is still effective, as is shown in FIG. 7(a) when both THRU are used. Therefore, it is anticipated that the present method can be extended for such applications.

The method in accordance with the present technology subtracts parasitic effects on-chip by use of passive microwave devices. Weak signals from small and high-impedance devices then emerge from the dramatically reduced background, particularly the otherwise overwhelming coupling capacitance effects. The data extraction procedure is straightforward and its accuracy depends on the symmetry and loss of the microwave structures. The design guidelines are straightforward.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for determining characteristics of a sample, comprising;
    providing a test structure having an input portion, an output portion, a test fixture portion, and a compensation portion;
    associating a sample to be tested with the test fixture portion;
    providing compensation means in the compensation portion selected to cancel parasitic effects within the test structure;
    providing an input signal to the input portion and the compensation portion;
    extracting a signal from the output portion representative of characteristics of a sample; and
    determining selected characteristics of the sample based on the extracted signal.

2. The method of claim 1, wherein providing a test structure comprises providing a microwave hybrid structure.

3. The method of claim 2, wherein providing a compensation means comprises providing a capacitor having an electrical value selected to match the electrical value of parasitic capacitance within the test structure.

4. The method of claim 2, further comprising configuring the hybrid structure to subtract the electrical value of the compensating means from a signal from the test fixture portion.

5. The method of claim 4, further comprising providing a 3-dB power divider between the input portion and the test fixture portion and the compensation portion, whereby a signal present to the input portion is divided evenly between the test fixture portion and the compensation portion.

6. The method of claim 2, wherein the hybrid structure is configured as a rat-race device, wherein a signal corresponding to the resonate frequency of the rat-race is applied to the input portion, wherein the input portion has an output coupled to the rat-race at a position spaced ¼ of a wavelength of the resonate frequency away from the output portion, and wherein the compensating portion has an output coupled to the rat-race at a position ¾ of a wavelength of the resonant frequency away from the output portion.

7. The method of claim 1, wherein the sample is selected from the group consisting of a metallic single-walled-carbon-nanotubes (mSWNT), a SWNT transistor, a minimum-size deep-submicron metal-oxide-semiconductor (MOS) field-effect-transistor (FET), a sub-micron MOS FET, a molecular device, a biofluid, a chemical, and a thin film.

8. Apparatus for determining characteristics of a sample, comprising;
   a test structure having an input portion, an output portion, a test portion, and a compensation portion; and
   a compensation means associated with the compensation portion, said compensation means selected to cancel parasitic effects within the test structure,
   wherein an input signal provided to the input portion and the compensation portion cause the input portion and the compensation portion to jointly produce an output at the output portion that varies depending on characteristics of a sample independently of parasitic effects associated with the test structure.

9. The apparatus of claim 8, wherein the test structure comprises a microwave hybrid structure.

10. The apparatus of claim 9, wherein the compensation means comprises a capacitor having an electrical value selected to match the electrical value of parasitic capacitance within the test structure.

11. The apparatus of claim 9, wherein the hybrid structure is configured to subtract the electrical value of the compensating means from a signal from the test fixture portion.

12. The apparatus of claim 8, further comprising a 3-dB power divider coupled between the input portion and the test fixture portion and the compensation portion, whereby a signal present to the input portion is divided evenly between the test portion and the compensation portion.

13. The apparatus of claim 9, wherein the hybrid structure is a rat-race device having a resonate frequency and having a first input port, a second input port and an output port, wherein said first input port is positioned $1/4$ of a wavelength of the resonate frequency away from said output port and said second input port positioned ¾ of a wavelength of the resonant frequency away from said output port.

14. The apparatus of claim 8, wherein the sample is selected from the group consisting of a metallic single-walled-carbon-nanotubes (mSWNT), a SWNT transistor, a minimum-size deep-submicron metal-oxide-semiconductor (MOS) field-effect-transistor (FET), a sub-micron MOS FET, a molecular device, a biofluid, a chemical, and a thin film.

* * * * *

UNITED STATES PATENT AND TRADEMARK OFFICE
CERTIFICATE OF CORRECTION

PATENT NO.        : 7,724,005 B1                                Page 1 of 1
APPLICATION NO.   : 12/179047
DATED             : May 25, 2010
INVENTOR(S)       : Wang et al.

It is certified that error appears in the above-identified patent and that said Letters Patent is hereby corrected as shown below:

Column 10, Line 15 "...second input port positioned% of a wavelength..." should read --...second input port positioned ¾ of a wavelength...--

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,724,005 B1 |
| APPLICATION NO. | : 12/179047 |
| DATED | : May 25, 2010 |
| INVENTOR(S) | : Pingshan Wang and Chunrong Song |

Page 1 of 1

It is certified that error appears in the above-identified patent and that said Letters Patent is hereby corrected as shown below:

In the Specification

Column 1, line 5 (insert prior to FIELD OF INVENTION)--This invention was made with government support under grant number W911NF-06-1-0355 awarded by the Department of Defense. The government has certain rights in the invention.--

Signed and Sealed this
Tenth Day of June, 2014

Michelle K. Lee
*Deputy Director of the United States Patent and Trademark Office*